United States Patent [19]

Kuo

[11] 4,294,001

[45] Oct. 13, 1981

[54] METHOD OF MAKING IMPLANT PROGRAMMABLE METAL GATE MOS READ ONLY MEMORY

[75] Inventor: Chang-Kiang Kuo, Houston, Tex.

[73] Assignee: Texas Instruments Incorporated, Dallas, Tex.

[21] Appl. No.: 1,571

[22] Filed: Jan. 8, 1979

[51] Int. Cl.³ .......................................... H01L 21/425
[52] U.S. Cl. .................................... 29/571; 29/576 B; 148/1.5; 357/91
[58] Field of Search ............... 29/571, 576 B; 148/1.5; 357/45, 91; 365/104

[56] References Cited

U.S. PATENT DOCUMENTS

| | | | |
|---|---|---|---|
| 3,914,855 | 10/1975 | Cheney et al. | 29/571 |
| 4,059,826 | 11/1977 | Rogers | 365/104 |
| 4,080,718 | 3/1978 | Richman | 29/571 |
| 4,107,548 | 8/1978 | Sakaba et al. | 307/205 |
| 4,208,726 | 6/1980 | McElroy | 365/104 |
| 4,208,780 | 6/1980 | Richman | 29/571 |

Primary Examiner—Aaron Weisstuch
Attorney, Agent, or Firm—John G. Graham

[57] ABSTRACT

An MOS read only memory or ROM is formed by a process compatible with standard P or N channel metal gate manufacturing methods. The ROM is programmed at a late stage of the process after the metal level of contacts and interconnections has been deposited and patterned. Address lines and gates are polysilicon with an overlying patterned metal layer and output and ground lines are defined by elongated heavily doped regions. Thin gate oxide is formed for every gate position, rather than for only the selected gates as in the prior standard programming method. Each potential MOS transistor in the array is programmed to be a logic "1" or "0" by ion implanting through the polysilicon gates where metal has been removed, using photoresist as a mask.

10 Claims, 9 Drawing Figures

METHOD OF MAKING IMPLANT PROGRAMMABLE METAL GATE MOS READ ONLY MEMORY

BACKGROUND OF THE INVENTION

This invention relates to semiconductor memory devices, and more particularly to a metal gate MOS read only memory and a process for making it.

Semiconductor memory devices are widely used in the manufacture of digital equipment such as minicomputers and microprocessor systems. Storage of fixed programs is usually provided in these systems by MOS read only memory devices or "ROMS". ROMS are made by semiconductor manufacturers on special order, the programming code being specified by the customer. The manufacturing process is lengthy, requiring dozens of steps, each taking up time and introducing materials handling and inventory factors. Customers require a short turn-around time or cycle time between receipt of the ROM code for a custom order and delivery of finished parts. For this reason, programming should be done late in the manufacturing process, but previous ways of doing this have not been compatible with standard metal gate procedures. The economics of manufacture of ROMS, and of mounting them on circuit boards in the system, are such that the number of memory bits per semiconductor chip is advantageously as high as possible. P-channel ROMS of up to 128K bits are manufactured at present. Within a few years, standard sizes will reach 256K and 1 megabit. This dictates that cell size for the storage cells of the ROM be quite small. Metal gate read only memories of small size can be relatively easily fabricated in the manner set forth in U.S. Pat. No. 3,541,543, assigned to Texas Instruments, but usually these are programmed by the gate level mask which is at an early stage in the process. A method of programming a ROM by ion implant prior to forming the polysilicon gate is shown in U.S. Pat. No. 4,059,826 to Gerald D. Rogers, assigned to Texas Instruments. Methods of programming by ion implant through a polysilicon gate for N-channel ROMS are shown in my prior copending applications Ser. No. 890,555, filed Mar. 20, 1978, and Ser. No. 900,549, filed Apr. 27, 1978, now U.S. Pat. No. 4,230,504 assigned to Texas Instruments. Also, previous cells have been programmed at the metal level mask by contact areas between metal lines and polysilicon gates, or by contacts between metal lines and N+ source or drain regions, using excessive space on the chip.

It is the principal object of this invention to provide an improved semiconductor permanent store memory cell of small size which may be programmed at a late stage in the manufacturing process. Another object is to provide a small-area MOS ROM cell which is made by a process compatible with standard MOS ROM metal gate manufacturing techniques and is programmable after the metal interconnections have been applied and patterned.

SUMMARY OF THE INVENTION

In accordance with an embodiment of the invention, a metal gate metal-oxide-semiconductor read only memory, or MOS ROM, is formed in an integrated circuit wherein an array of potential MOS transistors include polysilicon strips on a silicon bar which define the address lines and gates, and output and ground lines are defined by elongated doped regions. Metal overlies the polysilicon strips except above the gates. All of the gate positions have thin gate oxide, rather than only the selected gates as in prior standard metal gate programming methods. In the array, each potential MOS transistor is a storage cell, each cell being programmed to store a logic "1" or "0" by ion implanting through thin gate oxide and the polysilicon address line which forms the gate. This ion implant step is done after the metal contacts and interconnects for the peripheral circuitry have been patterned. Photoresist is used as the implant mask.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENTS

Figure 1:
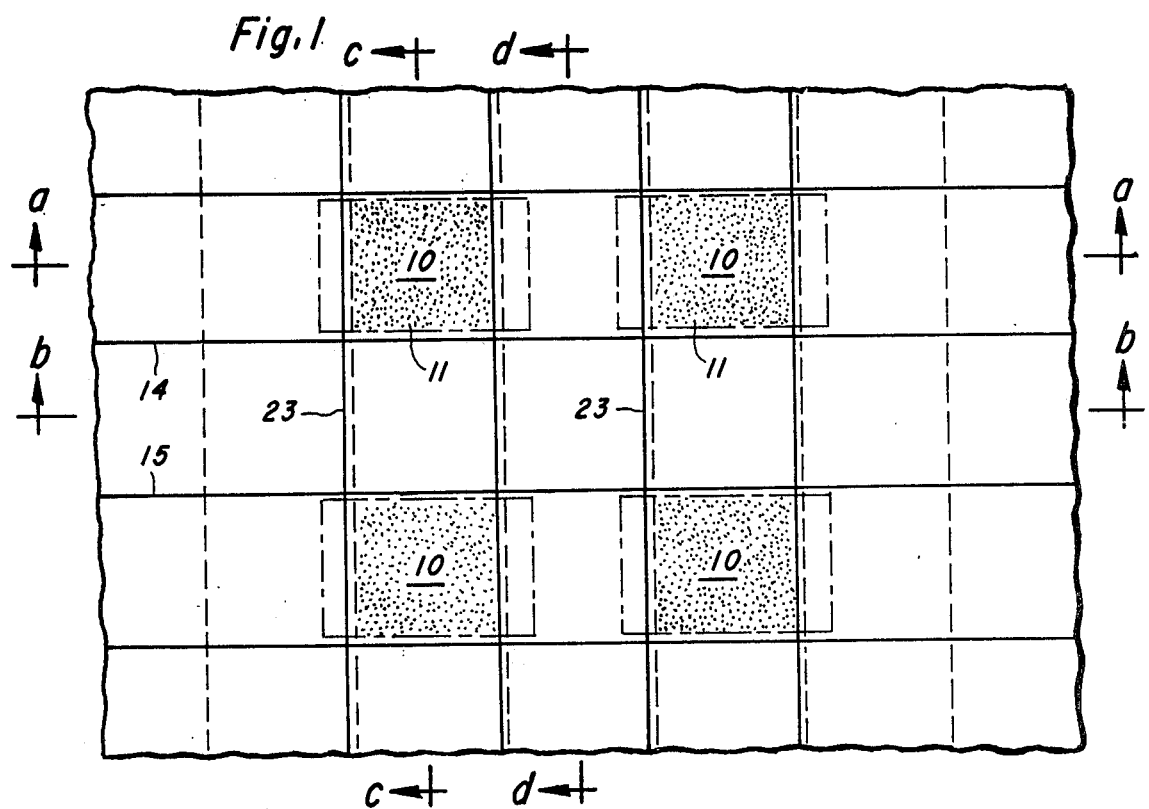
FIG. 1 is a greatly enlarged plan view of a small portion of a semiconductor chip showing the physical layout of a part of a ROM array made according to the invention.
Figure 2:
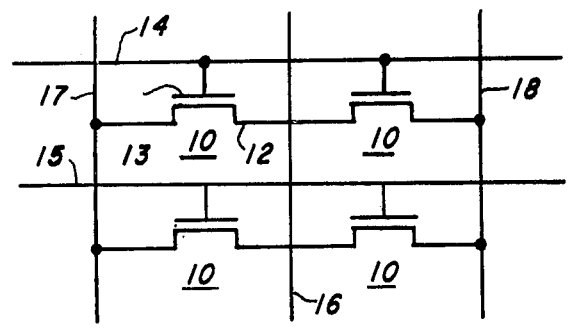
FIG. 2 is an electrical schematic diagram of the ROM of FIG. 1.
Figure 3A:
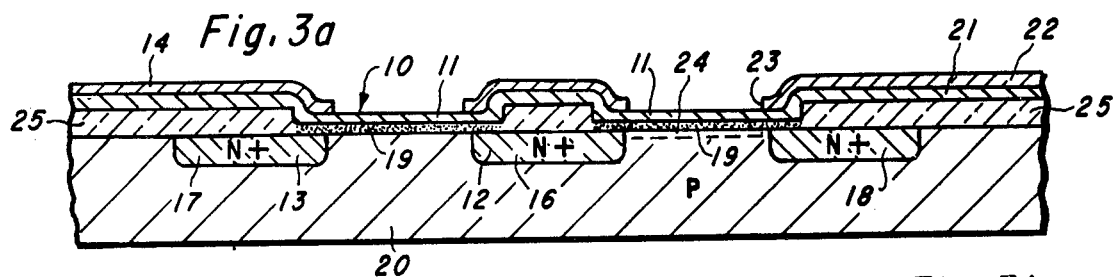
FIGS. 3a-3d are elevation views in section of the cell of FIG. 1, taken along the lines a—a, b—b, c—c, and d—d, respectively.
Figure 3B:
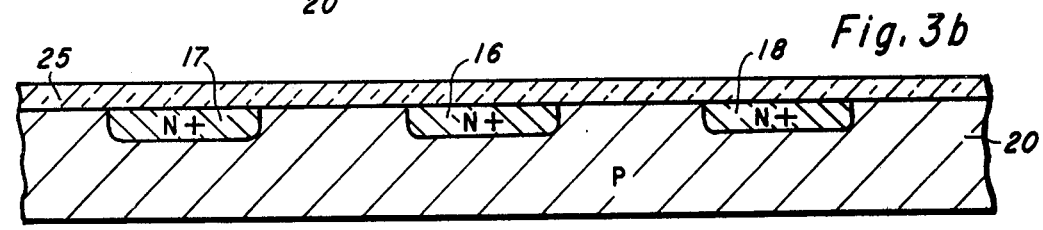
Figure 3C:
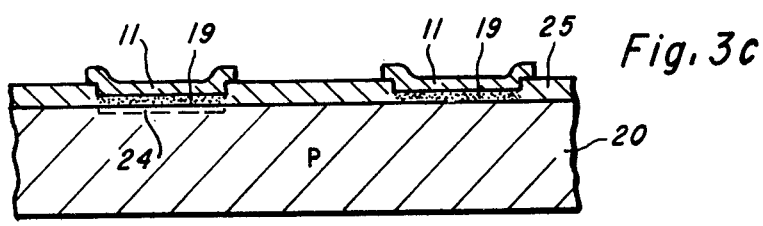
Figure 3D:
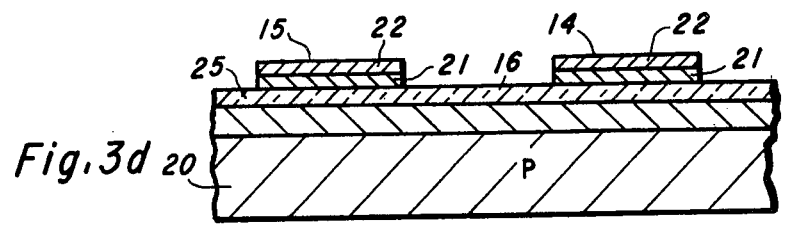

With reference to FIGS. 1, 2, and 3a-3d, a read only memory is illustrated which is programmed according to the invention. The array consists of a large number of cells 10, only four of which are shown. Each cell is an MOS transistor having a gate 11, a source 12 and a drain 13. The gates 11 are parts of X address lines 14 and 15 for the array. The sources are part of an N+ diffused region 16 which is connected to ground or Vss, while the drains are part of N+ diffused regions 17 and 18 which are Y output lines. A thin gate oxide layer 19 underlies the gates 11. The array, formed on a silicon bar 20, would typically contain perhaps 32K, 64K, or 128K cells, and the bar would be less than about 200 mils on a side or 40,000 sq. mil area depending upon the bit density. The four cells 10 shown would be on a minute part of the bar, perhaps one or two mils wide. A 64K ROM would require 256 of the X address lines such as 14 and 15 along with 256 of the Y lines like the lines 17 and 18, providing 65,536 bits. Although one Vss line 16 is shown for two Y lines, the array could be of a virtual ground type as disclosed in U.S. Pat. No. 3,934,233, issued to Roger J. Fisher and Gerald D. Rogers, or U.S. Pat. No. 4,021,781 issued to Edward R. Caudel, both assigned to Texas Instruments, in which case one Vss line for each eight or sixteen Y lines would be all that would be needed. Alternatively, the array could be of a virtual ground type wherein no dedicated ground lines are used, but instead one Y line is selected as ground, depending upon the Y address.

According to the invention, the X address lines 14 and 15 include a first layer 21 composed of polycrystalline silicon, and a second layer 22 composed of aluminum. Gaps are etched in the aluminum layer 22 over the gates 11 along strips 23. The cell array is programmed by a boron ion implant through the polycrystalline silicon layer 21 and the gate oxide 19, leaving the threshold voltage of selected ones of the cells 10 at a value above that which will be turned on by the voltage on the selected address line 14, 15, etc. In the example of four cells shown, the upper right cell and the lower left cell are implanted in this manner, the others are not. A layer of photoresist is used as the implant mask, with apertures formed in the photoresist above the cells 10 which are to be implanted. The ion implant creates implanted regions 24 in the channel areas of the selected transistors 10. The regions 24 are doped more heavily P-type than the original silicon substrate 20. A thick field oxide coating 25 covers parts of the bar not occupied by the gates of the transistors.

Figure 4A:
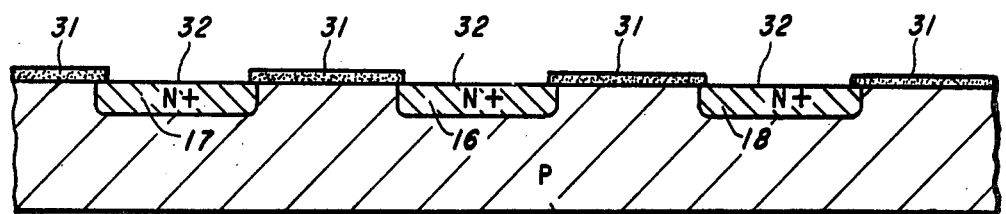
FIGS. 4a-4c are elevation views in section of the semiconductor device of FIGS. 1 and 3a-3d, at successive stages in the manufacturing process, taken generally along the line a—a in FIG. 1.
Figure 4B:
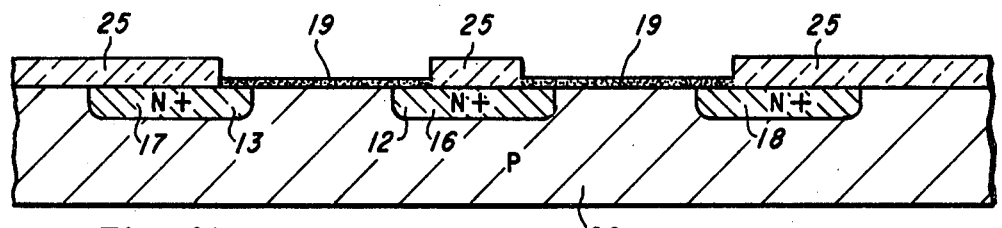
Figure 4C:
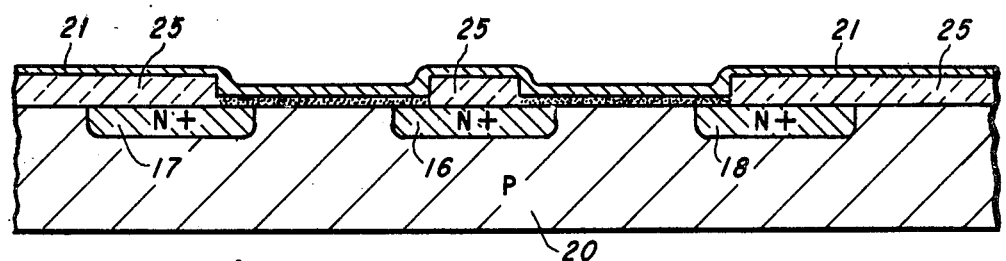

Turning now to FIGS. 4a-4c, a process for making the ROM array of the invention will be described. The section view of these FIGURES corresponds to the section view of FIG. 3a. The starting material is a slice of P-type monocrystalline silicon, typically three or four inches in diameter, cut on the <100> plane, doped during growing to a resistivity of about ten ohm-cm. As above, in the FIGURES the portion shown of the bar 20 represents only a very small part of the slice, perhaps one mil wide. After appropriate cleaning, the slice is oxidized by exposing to oxygen in a furnace at an elevated temperature of perhaps 1000 degrees C to produce an oxide layer 31 over the entire slice of a thickness of about 2000 Angstroms. A coating of photoresist is applied to the entire top surface of the slice, then exposed to ultraviolet light through a mask which defines the desired pattern of what are to be N-type diffused regions 16, 17 and 18. The resist is developed, leaving areas 32 where the oxide layer 31 is then etched away by a suitable etchant, removing the exposed part of this oxide layer 31; the etchant does not react with the photoresist or with silicon. Using the oxide layer 31 as a mask, the slice is now subjected to a diffusion step to produce the N+ type regions 16, 17 and 18, whereby As or P atoms are introduced into unmasked regions 32 of silicon using standard implant or diffusion techniques.

As seen in FIG. 4b, the next step in the process is formation of field oxide 25, which is done by subjecting the slices to steam or an oxidizing atmosphere at about 1000 degrees C for perhaps five hours causing a thick field oxide layer 25 of about 10,000 Angstroms thickness to be grown. This region extends into the silicon surface because silicon is consumed as it oxidizes.

The slice is now coated with another photoresist layer and then exposed to ultraviolet light through a mask which defines the gate areas of the transistors. After developing the photoresist, the slice is again subjected to an etchant which removes the parts of the field oxide layer 25 now exposed by holes in the photoresist, exposing bare silicon and the exposed silicon is cleaned. Next, the gate oxide 19 is grown by thermal oxidation to a thickness of about 800 Angstroms. The thin oxide areas overlap the N+ type source and drain regions 12 and 13 by an amount adequate to assure that there is no gap between the source or drain and the channel in the event of misalignment of masks in manufacture.

As seen in FIG. 4c a layer 21 of polycrystalline silicon is deposited over the entire slice in a reactor using standard techniques. Since the implant for programming penetrates this layer of polysilicon, the thickness is only about 4000 Angstroms. This layer is doped with phosphorus by a standard N+ diffusion to make it highly conductive. Next, before patterning the polysilicon, a coating of aluminum is deposited over the face of the slice, and then both aluminum and polysilicon are patterned using one photoresist mask. An etchant which removes aluminum is used first, then an etchant which removes polysilicon but not silicon oxide. In this manner, the edges of the polysilicon and metal along the strips 14 and 15 will be self-aligned so an alignment step is avoided in the manufacturing process. Then, a second metal patterning step is performed, using a new photoresist mask which exposes vertical strips 23 so that metal can be etched away above the gate 11.

Up to this point in the process all slices are exactly the same as no programming has been done in the ROM array. The slices are processed routinely to this stage with no requirement for separate inventory controls and separate identification of each lot. An inventory of slices finished up through metal patterning may be maintained for quick response to custom orders for ROM codes.

In accordance with the primary feature of the invention, the ROM array is programmed by first applying a photoresist layer as a unique mask which defines the ROM code. An aperture is defined in the photoresist over each cell 10 to be programmed as a "0", and each cell 10 to be a "1" is left covered. The slice is then subjected to a boron implant at about 150 KeV to a dosage of about $10^{13}$ per sq. cm. The energy level and dosage are dependent upon the thicknesses of the oxide layer 19 and the polysilicon gates 11, as well as the change in threshold desired. At this level, the ion implant penetrates the polycrystalline silicon gate 11 and gate oxide 19 to create an implanted region 24 in the channel area. This implant raises the threshold voltage to a value more positive than about +5V. Since the part operates on a supply voltage Vdd of +5V., the full logic 1 level will not turn on the transistor. The transistors covered by the photoresist will not be implanted so will retain the usual threshold voltage of about +0.8V. It is important that the mask alignment for creating the apertures in the photoresist for the programming mask is non-critical. The active channel area to be implanted has already been defined in previous processing steps with thin gate oxide 19.

In operation, the X address selects one of the lines 14 or 15, or one of the other of the 256 such lines in a 64K ROM, and this selected line is held at logic 1 level or about +5V. The remaining lines are held at Vss or logic 0. The Y address selects one of the 256 lines such as 17 and 18, and this is connected via the Y decoder to the output. In a dynamic ROM, the Y lines would be precharged prior to an access cycle, so the selected line will conditionally discharge depending upon whether the selected bit at the intersection of the addressed X and Y lines is programmed a 1 or a 0.

It is important to note that in the N-channel process described above, a relatively small number of masks are needed, compared to standard Si gate processes, and the cell layout is similar and more compact than in such standard ROMS. It is for this reason that P-channel ROMS are widely used in applications where low cost is more important than high speed, as in calculators, electronic games and other consumer products. In the conventional P-channel ROM process, however, the programming mask which defines the code is the second mask, the one which defines holes to be etched in the oxide 25 of FIG. 4b. This creates long cycle times from the time a code is defined to the time finished parts are delivered. Prototyping, i.e., manufacture of a few parts for checkout of the program for a new system in development, becomes impractical from a cost effectiveness standpoint.

Another alternative method of patterning the polysilicon and metal is to use two separate masks, one for defining and etching the metal, then, after etching away exposed poly another mask for removing metal above the gates 11 of the cells 10. Another alternative is to use a metal mask to define the metal pattern in the periphery (i.e., the decoders and input/output circuits surrounding the cell array) and to remove all of the metal 22 in the array of cells 10; this is followed by patterning the polysilicon 21 by using a separate polysilicon mask.

Usually the last mask used in MOS device processing is the protective overcoat mask which opens holes in a protective coating of glaze to expose bonding pads. Programming can be done using this mask by altering the above process slightly. After patterning layer 21 and metal layer 22, the protective overcoat is applied over the entire slice. Then, a coating of photoresist is applied and exposed to uV light through a mask which defines apertures over the bonding pads and apertures over the cells to be programmed as "0", then after developing the photoresist and etching away the photoresist overcoat, the slice is subjected to a boron implant using the photoresist and protective overcoat as an implant mask. Alternatively, two masks can be used, one to define the program code in photoresist, then after implant another to remove the overcoat from the bonding pads.

For typical P-channel metal gate processes, another process change is needed. This is because while it is practical to implant boron through polysilicon to program a ROM, optimum conditions do not readily exist to implant phosphorus through polysilicon because of higher than practical ion energy required due to its smaller projection range. Thus, in a P-channel process otherwise like the above, it is preferable to implant phosphorus over the entire ROM array just after the gate oxide 19 is grown, see FIG. 4b, to shift threshold voltages for all ROM cells to a high value, i.e., "0" storage. Programming of the ROM array by selectively implanting boron through the poly into the regions 24 lowers the threshold voltages for selected cells for "1" storage.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A method of making a read-only-memory comprising the steps of: forming a plurality of insulated gate field effect transistors in a face of a semiconductor body, each of the transistors having a source, a drain and a polysilicon gate, the transistors being in a regular pattern to provide an array of memory cells; applying a plurality of parallel polysilicon strips each including a plurality of said gates extending along said face with a metal layer over each strip except over the gates so the polysilicon of each gate is not covered by metal; and thereafter programming the array of memory cells by masked ion implant penetrating through the gates of selected ones but not all of the field effect transistors.

2. A method according to claim 1 wherein the step of programming uses a mask comprising a coating of photoresist applied after metal contacts and interconnections have been formed on the face.

3. A method according to claim 1, wherein said field effect transistors are N-channel silicon gate transistors, and contacts and interconnections are formed peripheral to the array by metal deposited in a thin film and patterned.

4. A method according to claim 3 wherein the programming step is performed after the metal is deposited and patterned, and wherein the semiconductor body is P-type silicon, the sources and drains are N-type, and the ion implant is P-type.

5. A method according to claim 1 wherein the metal layer is patterned by etching a plurality of parallel openings which are perpendicular to the polysilicon strips, the openings exposing the metal above all of the gates.

6. A method according to claim 1 wherein the metal layer is removed across its entire width above the gates to form gaps in the metal layer.

7. A method of making a semiconductor device comprising the steps of: forming a plurality of circuit elements in a face of a semiconductor body, each of the circuit elements having electrodes in the face and a control electrode overlying the face; the control electrode having multiple layers with a top layer for all devices being metal; removing said top layer over a part of each of the circuit elements; and thereafter changing the characteristics of the circuit elements by ion implant through the control electrodes at said part of selected ones but not all of the circuit elements using a mask.

8. A method according to claim 7 wherein the step of ion implant uses a mask comprising a coating of photoresist.

9. A method according to claim 7 wherein the circuit elements are field effect transistors with silicon gates, and at least some metal contacts and interconnections are formed by metal deposited in a thin film and patterned prior to the ion implant.

10. A method according to claim 9 wherein the semiconductor body is P-type silicon, sources and drains of the transistors are N-type, and the ion implant being P-type.

* * * * *